United States Patent [19]

Taddiken

[11] Patent Number: 5,469,163
[45] Date of Patent: Nov. 21, 1995

[54] MULTIPLE RESONANT TUNNELING CIRCUITS FOR POSITIVE DIGIT RANGE-4 BASE-2 TO BINARY CONVERSION

[75] Inventor: Albert H. Taddiken, McKinney, Tex.

[73] Assignee: Texas Instruments Incorporated, Dallas, Tex.

[21] Appl. No.: 65,969

[22] Filed: May 24, 1993

[51] Int. Cl.[6] .................................................. H03M 7/02
[52] U.S. Cl. ...................... 341/83; 341/133; 364/746.2; 326/134; 326/135
[58] Field of Search ............................... 341/82, 83, 102, 341/103, 104, 105, 133; 307/461, 478; 364/773, 746.2

[56] References Cited

U.S. PATENT DOCUMENTS

| | | | |
|---|---|---|---|
| 3,156,816 | 11/1964 | Kosonocky et al. | 341/133 |
| 3,207,913 | 9/1965 | Herzog | 307/478 |

FOREIGN PATENT DOCUMENTS

| | | | |
|---|---|---|---|
| 63-278421 | 11/1988 | Japan | 307/461 |

OTHER PUBLICATIONS

Turnbull, Jr., *Transistor–Tunnel Diode Inverter*, IBM Technical Disclosure Bulletin vol. 4, No. 2, Jul. 1961.
Hanyu, et al., "Multiple–Valued Programmable Logic Array Based on a Resonant–Tunneling Diode Model", *IEICE Trans. Electron.*, vol. E76–C, No. 7, Jul. 1993, pp. 1126–1132.
Kawahito, et al., "Multiple–Valued Current–Mode Arithmetic Circuits Based on Redundant Positive–Digit Number Respresentations", *IEEE*, 1991, pp. 330–339.
Seabaugh, et al., "Quantum Functional Devices: Present Status and Future Prospects", *Reprinted from FED Journal*, vol. 3, suppl. 1, 1993, pp. 9–20.
Micheel, "Heterojunction Bipolar Technology for Emitter–Coupled Multiple–Valued Logic in Gigahertz Adders and Multipliers", *Proceedings from IEEE Computer Society Technical Committee*, May 27–29, 1992, Sendai, Japan, pp. 18–26.
Micheel, et al., "Multiple–Valued Logic Computation Circuits Using Micro– and Nanoelectronic Devices", *IEEE Computer Society Press Reprint*, May 24–27, 1993, Sacramento, Calif., pp. 164–169.
Bate, "Nanoelectronics", *Nanotechnology 1*, vol. 1, No. 1, Jul. 1990, pp. 1–7–447.

(List continued on next page.)

*Primary Examiner*—Howard L. Williams
*Attorney, Agent, or Firm*—W. Daniel Swayze, Jr.; Richard L. Donaldson

[57] ABSTRACT

Multiple resonant tunneling devices offer significant advantages for realizing circuits which efficiently convert values represented by multivalued number systems to conventional binary representation. In one form of the invention, a number represented by a range-4 base-2 word is converted into a conventional binary word (range-2 base-2) having the same value. The conversion is accomplished by a series of decomposition stages 53, each decomposition stage 53 producing an interim range-4 base-2 word and a binary digit, which becomes one of the digits of the binary output word. Preferably, the decomposition at each stage is accomplished by a set of range-4 base-2 to binary converters 50, each of which operates on a single digit of the interim word. Preferably, summation circuits 52 sum outputs of adjoining range-4 base-2 converters 50 to form the new interim word. The least significant digit of the output of the decomposition stage becomes a digit of the output binary word. Preferably, the range-4 base-2 to binary converters 50 are multi-level folding circuits 54 connected by a voltage divider. Preferably, the multi-level folding circuits contain multiple-peak resonant tunneling transistors 56 (e.g. an FET 58 and a multiple-peak resonant tunneling diode 60) which exhibit multiple negative differential transconductance. The novel circuits presented allow the results of multivalued logic operations to be translated to binary representation at very high speed. Additionally, because they make use of resonant tunneling devices, the novel converter circuits described herein may be fabricated with very few components.

21 Claims, 4 Drawing Sheets

OTHER PUBLICATIONS

Goto, et al., "A 250Mhz 16b 1–Million Transistor BiCMOS Super–High–Speed Video Signal Processor", *IEEE International Solid–State Circuits Conference,* 1991, pp. 254–255 and 325.

Micheel, et al., "Differential Multiple–Valued Logic Using Resonant Tunneling Diodes", *Electronic Technology Laboratory (Wright–Patterson AFB, Ohio,* pp. 1–7.

Taddiken, et al., "Application of Resonant Tunneling Devices in Future Electronic Circuits", *Government Microcircuit Applications Conference–Digest of Papers,* 1992, pp. 13–16.

Frazier, et al., "TP 11.4: Nanoelectronic Circuits Using Resonant Tunneling Transistors and Diodes", *IEEE International Solid–State Circuits Conference,* 1993, pp. 174–175 and 138–139.

Yokoyama, et al., "Resonant–Tunneling Hot Electron Transistor (RHET)", *Solid–State Electronics,* vol. 31, No. 3/4, 1988, pp. 577–582.

Capasso, et al., "Negative Transconudctance Resonant Tunneling Field–Effect Transistor", *Appl. Phys. Lett.,* 51(7), 17 Aug. 1987, pp. 526–528.

Sollner, et al., "Resonant Tunneling Through Quantum Wells at Frequencies up to 2.5 THz", *Appl. Phys. Lett.,* 43(6), 15 Sep. 1983, pp. 588–595.

Capasso, et al., "8 Quantum–Effect Devices", *High–Speed Semiconductor Devices,* pp. 465–521.

Chang, et al., "Resonant Tunneling in Semiconductor Double Barriers*", *Appl. Phys. Lett.,* vol. 24, No. 12, 15 Jun. 1974, pp. 593–595.

MULTIPLE RESONANT TUNNELING CIRCUITS FOR POSITIVE DIGIT RANGE-4 BASE-2 TO BINARY CONVERSION

CROSS-REFERENCE TO RELATED APPLICATIONS

| Title | Serial No. | Inventor(s) | Docket # |
|---|---|---|---|
| High Frequency High Resolution Quantizer | 07/952,394 | Taddiken | 17052 |
| Multiple Resonant Tunneling Circuits for Positive Digit Multivalued Logic Operations | | Taddiken | 17811 |
| Multiple Resonant Tunneling Circuits for Signed Digit Multivalued Logic Operations | | Taddiken, Micheel | 17813 |

1. Field of the Invention

This invention generally relates to integrated circuit devices and more particularly to multivalued logic circuits comprising resonant tunneling devices.

2. Background of the Invention

Without limiting the scope of the invention, its background is described in connection with resonant tunneling devices and multivalued logic.

Resonant Tunneling Devices

Within the last decade, heteroepitaxial technology has allowed researchers to explore the electrical properties of a variety of superlattice, quantum well, and resonant tunneling structures. The first proposals and investigations of the resonant tunneling diode (hereinafter referred to as a RTD) were reported by Chang, Esaki, and Tsu (*Applied Physics Letters,* 24, p. 593) and subsequently given impetus by Sollner et al. (*Applied Physics Letters,* 43, p.588) who observed large negative differential resistance (hereinafter referred to as NDR) in these structures. Because only discrete energy states are available for charge transport through quantum wells, the current-voltage relationship of a resonant tunneling diode may exhibit a peak, i.e., for applied voltages increasing from zero, the diode current increases, then decreases for a range of larger applied voltages. Multiple peak resonant tunneling devices (hereinafter referred to as M-RTD) consisting of series combinations of RTDs in epitaxial stacks have also been demonstrated. Fifteen resonant peaks were achieved in a single heterostructure at room temperature recently fabricated at Texas Instruments.

Since the initial investigations of the RTD, many three-terminal resonant tunneling devices have been proposed and demonstrated (see, for example, F. Capasso, S. Sen and F. Beltram, *High Speed Semiconductor Devices* (S. M. Sze, ed.), p. 465, John Wiley & Sons, New York). Integration of RTDs into one or another of the terminals of conventional transistors has led to a large family of resonant tunneling transistors. Among the most promising of these transistors are: the resonant tunneling bipolar transistor (RTBT) (see, for example, F. Capasso, S. Sen, and A. Y. Cho, *Applied Physics Letters,* 51, p. 526); the resonant tunneling hot electron transistor (RHET) (see, for example, N. Yokoyama et al., *Solid State Electronics,* 31, p. 577); and the resonant tunneling field effect transistor (RTFET). These devices are fabricated by placing RTDs in the emitter or drain terminals of heterojunction bipolar transistors, hot electron transistors or field effect transistors, respectively.

Nanoelectronic devices, such as resonant tunneling diodes and transistors, are under investigation in many laboratories for their potential to operate at dimensions much smaller than conventional transistors can function. The goal of these device designs is to harness the quantum effects themselves to allow scaling to dimensions on a nanometer scale. Examples of such nanoelectronic devices are described, for example, in:

U.S. Pat. No. 4,581,621, "Quantum Device Output Switch", issued Apr. 8, 1986, to Reed;

U.S. Pat. No. 4,704,622, "Negative Transconductance Device", issued Nov. 3, 1987, to Capasso et al.;

U.S. Pat. No. 4,721,983, "Three Terminal Tunneling Device", issued Jan. 26, 1988, to Frazier;

U.S. Pat. No. 4,849,799, "Resonant Tunneling Transistor", issued Jul. 18, 1989, to Capasso et al.;

U.S. Pat. No. 4,851,886, "Binary Superlattice Tunneling Device and Method", issued Jul. 25, 1989, to Lee et al.;

U.S. Pat. No. 4,853,753, "Resonant-Tunneling Device, and Mode of Device Operation", issued Aug. 1, 1989, to Capasso et al.;

U.S. Pat. No. 4,912,531, "Three-Terminal Quantum Device", issued Mar. 27, 1990, to Reed et al.;

U.S. Pat. No. 4,959,696, "Three Terminal Tunneling Device and Method", issued Sep. 25, 1990, to Frensley et al.; and U.S. Pat. No. 4,999,697, "Sequential-Quenching Resonant-Tunneling Transistor", issued Mar. 12, 1991, to Capasso et al.

Multivalued Logic

Binary arithmetic integrated circuits (ICs) have enabled a revolution in the performance of embedded coprocessors and high-performance computers, but scaling limits will ultimately prevent further increases in the speed and density of conventional ICs. Soon after the year 2000, quantum mechanical effects will set fundamental limits on the scalability of conventional transistors (see, for example, R. T. Bate, *Nanotechnology,* 1, p. 1, 1990). Feature sizes less than approximately 0.1 µm will cause leakage in conventional devices that will prevent scaling from increasing IC performance.

In the future, ultra-high performance digital systems will require clock rates in excess of 10 GHz with minimum data latency. Current systems, using binary computation based on silicon VLSI technology, can achieve reasonably good performance by using complex carry-ripple reduction schemes; however, data latency and ultra-fast computing requirements will make this approach unsuitable for certain classes of systems.

Multivalued Logic (hereinafter referred to as MVL) circuits have the potential for increased speed and density (for the same minimum feature geometry) since multiple binary bits may be simultaneously processed in a single MVL circuit. For examples of multivalued logic adders and multipliers which offer ripple-carry free operation through the use of redundant number systems, see, for example: L. J, Micheel, *Proceedings of the International Symposium* on MVL, 1992; J. Goto et al., *International Solid State Circuits Conference,* 1991; and S. Kawahito, K. Mizuno, and T. Nakamura, *Proceedings of the International Symposium* on MVL, 1991. To date, implementation of these approaches has been proposed based on conventional integrated circuit families (e.g. CMOS and heterojunction ECL).

SUMMARY OF THE INVENTION

Multivalued logic (MVL) computing circuits offer substantial gains in both speed and density over traditional binary implementations; however, because MVL integrated circuits will not stand alone in the near term, interoperability with conventional binary circuits is necessary. An efficient implementation of a multivalued to binary converter which does not mitigate the performance benefits of multivalued logic processors is highly desired.

It has been discovered that the multiple resonant tunneling devices offer significant advantages for realizing circuits which efficiently convert values represented by multivalued number systems to conventional binary representation. The operations necessary to convert multivalued words to binary words can be realized very efficiently by circuits which make use of the negative differential resistance exhibited by resonant tunneling devices. Conventional technologies (e.g. CMOS and heterojunction ECL) seem an unnatural choice for MVL ICs due to the complex circuits and high component counts required. Resonant tunneling devices have novel characteristics that will enable ultra-high speed and ultra-high density circuits even before the quantum scaling limits are reached. Multivalued logic circuits implemented with resonant tunneling devices will achieve increased speed and density over binary circuits and multiple-valued circuits implemented in conventional IC technologies since multiple binary bits are very efficiently processed by architectures which make use of devices exhibiting multiple negative transconductance regions.

Generally, and in one form of the invention, a number represented by a range-4 base-2 word is converted into a conventional binary word (range-2 base-2) having the same value. The conversion is accomplished by a series of decomposition stages, each decomposition stage producing an interim range-4 base-2 word and a binary digit, which becomes one of the digits of the output word. Preferably, the decomposition at each stage is accomplished by a set of range-4 base-2 to binary converters, each of which operates on a single digit of the interim word. Preferably, summation circuits sum outputs of adjoining range-4 base-2 converters to form the new interim word. The least significant digit of the output of the decomposition stage becomes a digit of the output binary word. Preferably, the range-4 base-2 to binary converters are multi-level folding circuits connected by a voltage divider. Preferably, the multi-level folding circuits contain multiple-peak resonant tunneling transistors which exhibit multiple negative differential transonductance.

The invention disclosed herein is apparently the first logic circuit operable to convert values represented by multivalued number systems to conventional binary representation. It is also apparently the first circuit containing resonant tunneling devices operable to perform conversion from multivalued logic to binary.

The converter of the present invention provides several technical advantages. For example, the novel circuits presented allow the results of multivalued logic operations to be translated to binary representation at very high speed. Additionally, because they make use of resonant tunneling devices, the novel converter circuits described herein may be fabricated with very few components. Other technical advantages will be readily apparent to one skilled in the art from the following descriptions, figures and claims.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

DETAILED DESCRIPTION OF THE PREFERRED EMBODIMENTS

The advantages of multivalued logic arithmetic are illustrated in the following example. In most conventional digital processors, number are represented in a base-2 range-2 numeration system. That is, the unit value of each digit increases in base-2 progression (1,2, 4, 8, etc.), and each digit may take on one of only two values (0 or 1). Conventional digital processor architectures can add pairs of N-bit numbers in a single processor cycle. However, time delays occur during binary addition because carry bits must propagate through the adder circuitry. Carry propagation delays set an upper limit on processor performance. For example, adding the following numbers in base-2 range-2 representation using simple binary arithmetic requires the long-distance propagation of a carry bit across the entire addition chain:

```
  01111 = 15(base 10)
+ 00001 =  1(base 10)
  10000 = 1*(16) + 0*(8) + 0*(4) + 0*(2) +
          0*(1) = 16(base 10)
  ← carry
```

The carry propagation problem can be eliminated if data operands are encoded and processed using a multivalued representation. This approach uses a higher range to represent information so that ripple carries are never produced, and carry propagation delays are eliminated. The numbers from the previous example can be added without the need for carry generation when represented in base-2 range-3, where each column of bits is separately added using numerical rather than binary addition. The range-3 representation of the result makes carry ripple unnecessary:

```
  01111 = 15(base 10)
+ 00001 =  1(base 10)
  01112 = 0*(16) + 1*(8) + 1*(4) + 1*(2) +
          2*(1) = 16(base 10)
```

It is important to note that, even though the range of the result is higher, the base of the number system used to represent the result has not changed. That is, the unit value of each digit position still increases in the base-2 progression of 1, 2, 4, 8, and so on. The use of range-N numeration to encode information in base-M progression is called redundant digit M,N coding. If the digits may take on only positive values, then the numeration system is referred to as redundant positive digit M,N coding. The numeration system of the example above is therefore redundant positive digit 2,3 coding. A numeration system which allows positive and negative digit values is referred to as redundant signed digit M,N coding.

Figure 1:
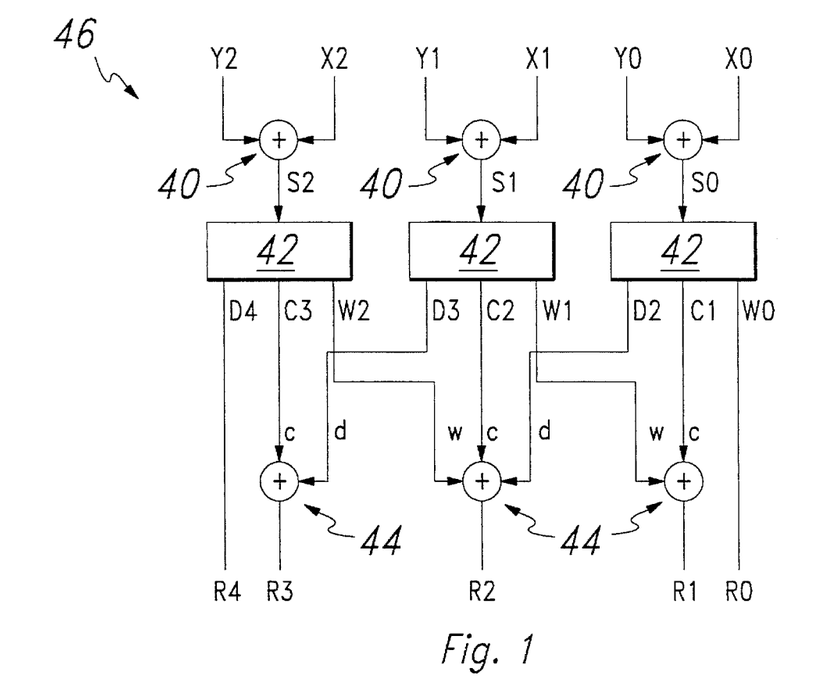
FIG. 1 is a block diagram of a redundant positive digit range-4 base-2 adder.

The block diagram of an adder of numbers represented by a redundant positive digit 2,4 coding scheme is shown in FIG. 1. Digits may take on the values 0, 1, 2, and 3 (positive digit range-4). The progression of the numeration system is base-2. The block diagram is for input words of up to three digits in word width, although the technique may obviously be extended to arbitrary word widths. Positive redundant digit 2,4 coding is used to represent base-2 information in a redundantly encoded (range-4) representation so that ripple carries are never produced. This means that any output digit, e.g. $R_2$, is completely determined by the first six input digits of equal or lower significance, e.g. $X_2$, $Y_2$, $X_1$, $Y_1$, $X_0$ and $Y_0$. Addition is performed in three steps:

Step 1: $S_i = X_i + Y_i$

Step 2: $4D_{i+2} + 2C_{i+1} W_i = S_i$

Step 3: $R_i = W_1 + C_i + D_i$ where the base-10 value of the result is given by $$\sum_{i=0}^{n-1} 2^i R_i$$

where n is the number of digits in the output word.

With reference to FIG. 1, Pairs of input digits $(X_i, Y_i)$ are first summed using a two-input summation circuit 40 to produce outputs digit sums $S_i = X_i + Y_i$ (Step 1, above). Each digit sum is then converted into a 3-bit binary code using a range-7 multivalued-to-binary converter (hereinafter referred to as R7MBC) 42. The R7MBC 42 performs the decomposition function of Step 2, above. Finally, the binary outputs from the adjoining R7MBCs 42 are shared and summed by three-input summation circuits 44 to produce a range-4 output result (Step 3, above). The adder shown can be extended to compute the sum of two numbers of arbitrary word width. The speed of the circuit is independent of the number of input digits because only local intermediate results are shared within the circuit.

Figure 2:
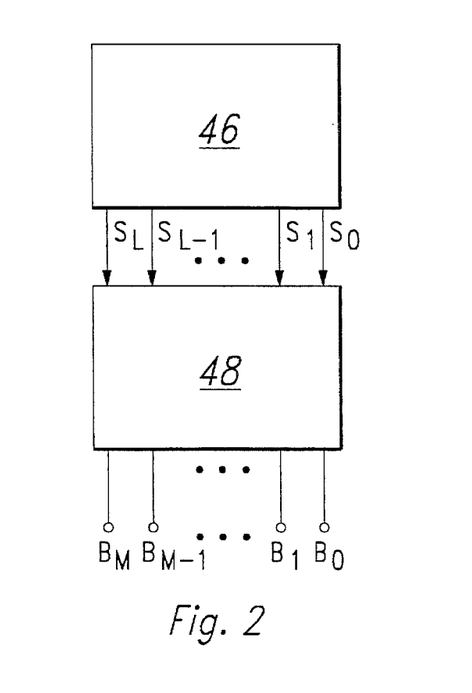
FIG. 2 is a block diagram of a multivalued logic processor and a multivalued-to-binary converter.

Multivalued logic (MVL) computing circuits offer substantial gains in both speed and density over traditional binary implementations; however, because MVL integrated circuits will not stand alone in the near term, interoperability with conventional binary circuits is necessary. FIG. 2 is a block diagram of a multivalued logic processor 46 which produces an output word of width L+1 digits, labelled $S_0$ through $S_L$. The multivalued to binary converter 48 receives the multivalued word S and converts it to the binary word B having M+1 digits, labelled $B_0$ through $B_M$. (A converter from binary base-2 to multivalued base-2 is not necessary because a multivalued processor may accept a conventional binary word as input without modification.) An efficient implementation of a multivalued to binary converter 48 which does not mitigate the performance benefits of multivalued logic processors is highly desired.

It has been discovered that the operations necessary to convert multivalued words to binary words can be realized very efficiently by circuits which make use of the negative differential resistance exhibited by resonant tunneling devices.

Preferred embodiment

In the following discussion of the operation of the preferred circuit embodiments, the inputs and outputs will be referred to as states rather than voltages. A state corresponds to a digit's value. The voltage corresponding to each state is a design choice and the correspondence between voltage and state will be obvious to one of ordinary skill in the art. In a particular circuit design, for example, each state might differ from the next state by 0.3 volts. In the preferred embodiment of the range-4 base-2 to binary converter, circuit voltages are generally proportional to the states they represent. It is contemplated that in some alternate embodiments the relationship between voltage and state need not be strictly linear nor strictly proportional.

Figure 3:
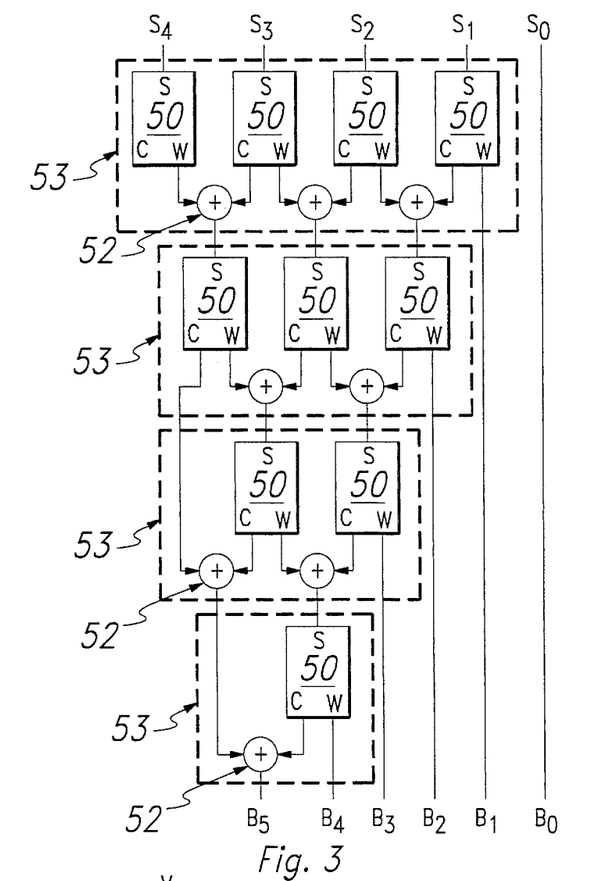
FIG. 3 is a block diagram of the preferred embodiment of a positive digit range-4 base-2 to binary converter.

The block diagram of the preferred embodiment of a positive digit range-4 base-2 to binary converter is shown in FIG. 3. The input is a positive digit range-4 base-2 word S which is the output word of the positive digit range-4 base-2 adder of FIG. 2, consisting of the digits $S_0$ through $S_4$, where $S_0$ is the least significant digit. In general, the most significant and least significant digits of S are binary (i.e., they may only take on values 0 or 1) due to the design of the adder. Similarly, the next-most significant and next-least significant digits of S may only take on the values 0, 1, and 2. The preferred embodiment multivalued to binary converter, described hereinbelow, operates on such input words.

In FIG. 3 the input word S is shown to be 5 digits wide, although the converter can obviously be extended to operate on input words of arbitrary width. Digits are decomposed by range-4 base-2 to binary converters 50. The output of each converter 50 is a two digit binary word which has the same value as the multivalued input digit (the carry digit C is the most significant binary digit, W is the least significant). The C and W outputs from adjoining converters 50 are summed by summation circuits 52, which produce interim range-3 digits. These interim range-3 digits are in turn decomposed by additional range-4 base-2 to binary converters 50. As shown in FIG. 3, each decomposition stage 53 is a set of range-4 base-2 to binary converters and the associated summation circuits. A decomposition stage operates on an range-4 base-2 word which is W digits wide and produces a W-1 digit wide range-4 base-2 word and one binary bit (the W output of the least significant converter of the decomposition stage is necessarily a binary output digit). Generally, L decomposition stages are required for an input word which is L+1 digits wide.

Figure 4:
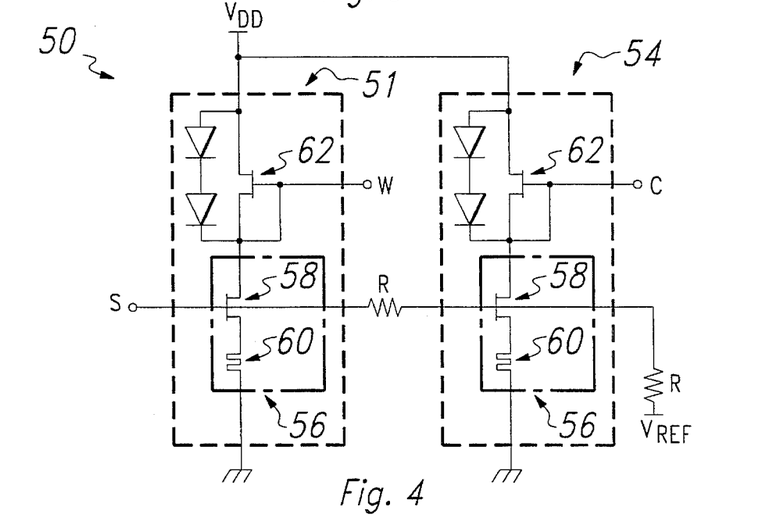
FIG. 4 is a schematic of the preferred embodiment of a range-4 base-2 to binary converter.
Figure 5:
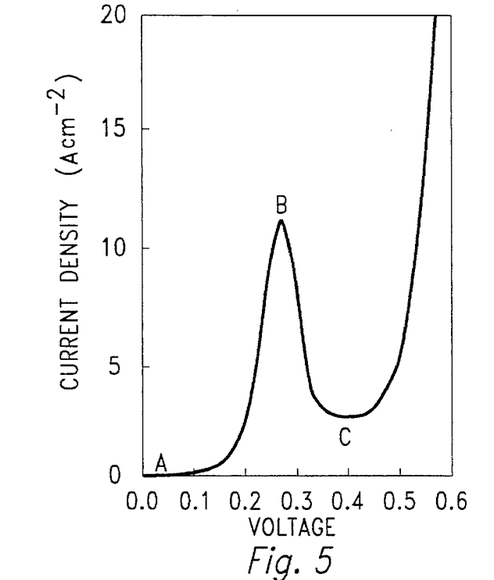
FIG. 5 is a graph of the current-voltage characteristic of a typical resonant tunneling diode.

The preferred embodiment of the range-4 base-2 to binary converter 50 is shown in FIG. 4. The circuit comprises two multi-level folding circuits 54 connected by a voltage divider (the resistors labeled R). Each multi-level folding circuit comprises an active load 62 and a multiple negative differential transconductance device, which preferably is a multiple peak resonant tunneling transistor 56. In the preferred embodiment, the multi-peak resonant tunneling transistor 56 is the combination of a switching transistor 58 and a multiple-peak resonant tunneling diode 60 integrated into the transistor source, or, alternatively, a discrete transistor with an M-RTD or multiple single peak RTDs connected to the source. The input voltage to the second multi-level folding circuit is one-half the input voltage S, due to the voltage divider (resistors R). The operation of a single multi-level folding circuit is described and explained hereinbelow.

Figure 6A:
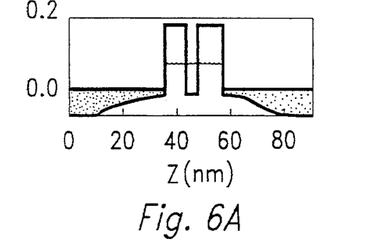
FIGS. 6a–6c are conduction band energy diagrams of a typical resonant tunneling diode with increasing applied voltages.
Figure 6B:
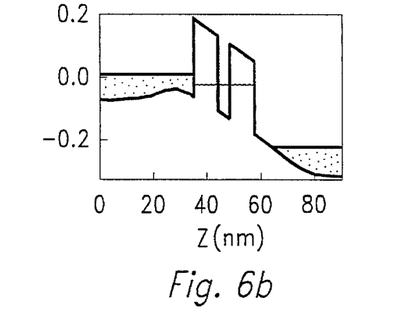
Figure 6C:
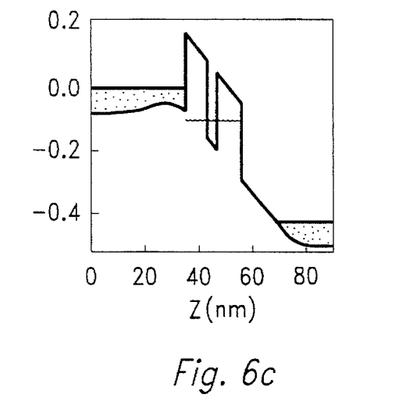
Figure 7:
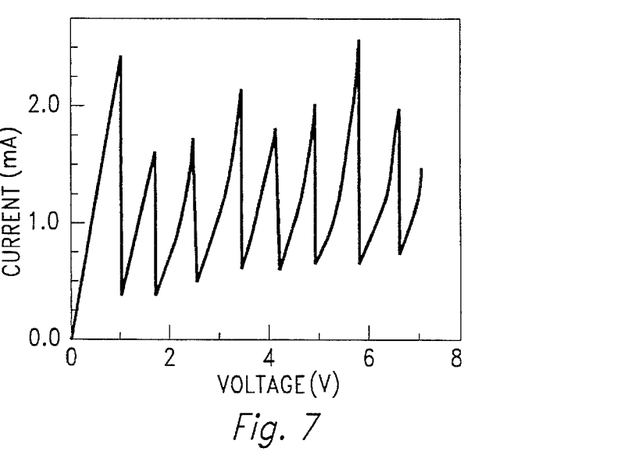
FIG. 7 is a graph of the current-voltage characteristic of an eight-peak resonant tunneling diode.

A resonant tunneling device (RTD) is a device which exhibits negative differential resistance due to resonant tunneling of charge carriers through one or more quantum wells. As shown in FIG. 5 and FIGS. 6a–6c, a peak in the I–V curve of an RTD occurs when the applied bias aligns a quantum conduction state within the device with the Fermi level in one electrical contact. FIGS. 6a, 6b and 6c show the conduction band energy diagrams of the RTD under the applied voltages at points A, B and C in FIG. 5, respectively. The position of the I–V peak in bias voltage is adjustable by controlling the heterostructure composition and layer thicknesses used to fabricate the device. RTDs can be integrated in series to produce a multiple peak RTD (M-RTD) with I–V characteristics such as the example I–V characteristic shown in FIG. 7. In this example, the eight-peak I–V characteristic was obtained by fabricating a stack of RTDs within the same heterostructure. Again, both the number and bias separation of peaks are controlled parameters in the fabrication process.

Figure 8:
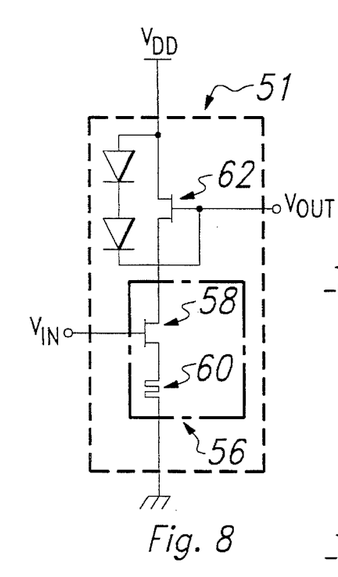
FIG. 8 is a schematic of a multi-level folding circuit which implements one output of the range-4 base-2 to binary converter.
Figure 9A:
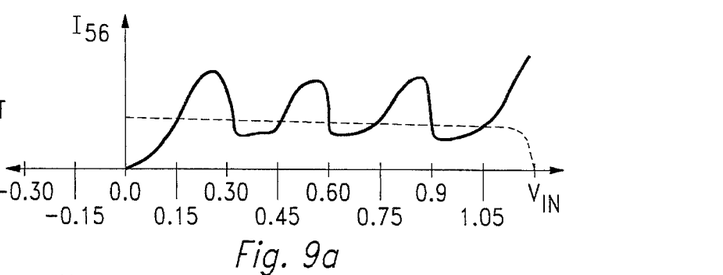
FIG. 9a is a graph showing the intersections of the current-voltage characteristic of the multiple-peak resonant tunneling transistor with the load line of the active load of FIG. 8.
Figure 9B:
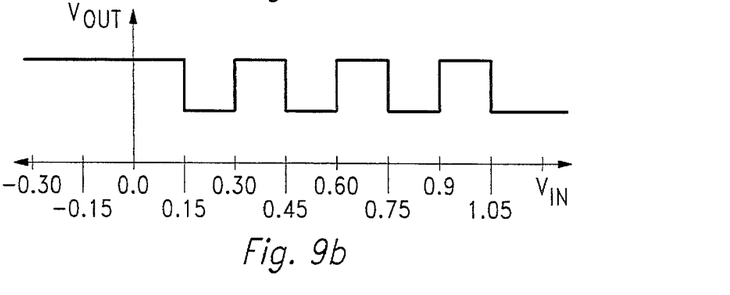
FIG. 9b is a graph of the transfer function of the multi-level folding circuit of FIG. 8.

The operation of one output of the preferred embodiment range-4 base-2 to binary converter 50 will be explained with reference to FIGS. 8, 9a and 9b. The first preferred embodiment of the multi-level folding circuit 54 comprises a resonant tunneling transistor 56 and a depletion mode FET 62 which acts as an active load. As shown in FIG. 8, the resonant tunneling transistor 56 may be represented by, in this embodiment, switching transistor 58 and a multiple-peak resonant tunneling diode 60. A resonant tunneling transistor 56 may be, for example, the combination of an FET and a multiple-peak resonant tunneling diode integrated into the FET source, or, alternatively, a discrete FET with an M-RTD or multiple single peak RTDs connected to the source. In the preferred embodiment, the switching transistor 58 is a depletion mode FET with a threshold voltage $V_t$ of −0.3 V. FIG. 9a shows the relationship between the resonant tunneling transistor drain current $I_{56}$ and $V_{in}$. Three resonant peaks are shown, occurring at approximately 0.3, 0.6 and 0.9 V. The dashed line in FIG. 9a is the load line of the active load 62. As shown, the saturation current of the active load 62 transistor is chosen to be less than the peak currents but more than the valley currents of the resonant tunneling transistor 56.

Figure 10:
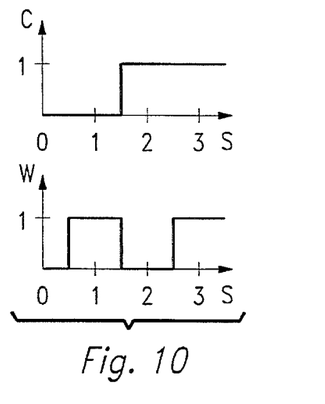
FIG. 10 is a graph of the transfer function of the preferred embodiment of the range-4 base-2 to binary converter.

As $V_{in}$, the gate voltage of the switching transistor 58, is swept upward from −0.3 V, the output voltage $V_{out}$, which begins high, goes low when $V_{in}$ reaches $V_{gs,on}$ (the 'on' gate-to-source voltage) of the switching transistor 58 plus the first peak voltage of the M-RTD 60. As the gate voltage continues to increase, the M-RTD 60 restricts the switching transistor 58 current as it transitions through the NDR region until the gate voltage reaches $V_{gs,off}$ (the 'off' gate-to-source voltage) plus the first valley voltage of the M-RTD 60 and $V_{out}$ is once again high. For further increases in $V_{in}$, this cycle repeats and the input/output relation is as shown in FIG. 9B. The diodes shunting the active load transistor 62 clamp the low $V_{out}$ state to prevent the switching transistor 48 from entering its knee (triode) region. As can be seen in FIGS. 9a and 9b, the saturation current of the active load transistor 62 determines the precise voltage at which $V_{out}$ switches from one output voltage to the other. The preferred embodiment of the range-4 base-2 to binary converter 50 is formed from two of these multilevel folding circuits 54 combined using a resistor ladder, as shown in FIG. 4. The transfer function of the preferred embodiment of the range-4 base-2 to binary converter is shown in FIG. 10. In general, to achieve the transfer function shown in FIG. 10, the resonant tunneling transistor 56 should exhibit at least two resonant peaks. The choice of number and spacing of resonant peaks will be influenced by the correspondence between state and voltage (i.e. the correspondence between the value of a digit and the voltage which represents that value).

The three-peak M-RTD characteristic shown in FIG. 9a can be obtained either by a series combination of three RTDs or by use of a single coupled quantum well heterostructure. When RTDs are combined in series, the off-resonance RTDs in the chain may introduce an undesirable internal series resistance, $R_S$. This series resistance can cause a voltage hysteresis equal in magnitude to the product of the difference between the peak and valley currents and the difference between the negative differential resistance and the positive series resistance $R_S$. The onset of this hysteresis effect occurs when the accumulated series resistance exceeds the RTD negative differential resistance. The total number of RTDs that can be combined in series, therefore, is generally limited by the accumulated series resistance of the specific device implementation.

The electrical properties of a resonant tunneling device are determined, in part, by the thicknesses, materials and doping of its constituent layers. An example of a resonant tunneling diode structure which exhibits a three-peak characteristic is given in Table 1. The structure is a stack of epitaxially formed layers, layer 1 formed on the substrate, layer 2 formed on layer 1, etc.

TABLE 1

| Layer Number | Material | Thickness | Description |
| --- | --- | --- | --- |
| 1 | InGaAs | 0.5 μm | Cathode contact layer |
| 2, 10, 18 | InGaAs | 500 Å | Ohmic layer |
| 3, 11, 19 | InGaAs | 20 Å | Spacer layer |
| 4, 12, 20 | AlAs | 20 Å | Barrier layer |
| 5, 13, 21 | InGaAs | 10 Å | Quantum Well |
| 6, 14, 22 | InAs | 20 Å | Notch in Quantum Well |
| 7, 15, 23 | InGaAs | 10 Å | Quantum Well |
| 8, 16, 24 | AlAs | 20 Å | Barrier Layer |
| 9, 17, 25 | InGaAs | 20 Å | Spacer Layer |
| 26 | InGaAs | 500 Å | Ohmic Layer |

TABLE 1-continued

| Layer Number | Material | Thickness | Description |
| --- | --- | --- | --- |
| 27 | InGaAs | 2500 Å | Anode Contact Layer |

Figure 11:
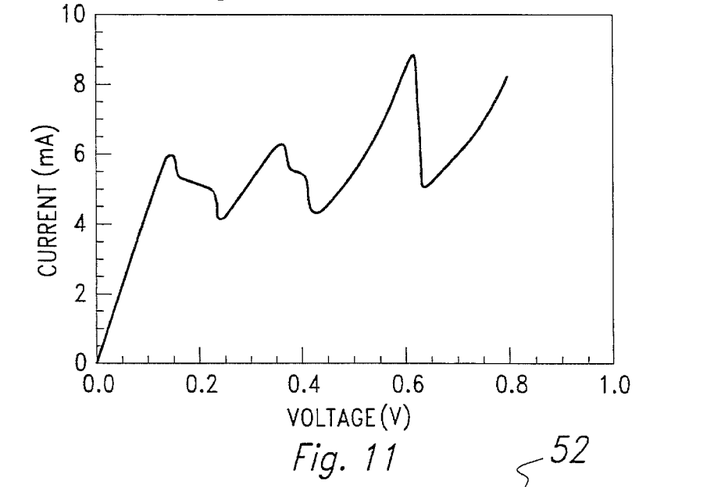
FIG. 11 is a graph of the current-voltage characteristic of a demonstrated three-peak resonant tunneling diode.

The structure give by Table 1 exhibits the current-voltage characteristic shown in FIG. 11. Two traces are present in this figure, although only a single trace is apparent. One trace shows the characteristic for a positive voltage ramp beginning at zero bias, and a second trace begins at 0.8 V and decreases to 0 V. The difference between these curves is less than the 3 mV resolution of the measurement equipment.

To achieve sufficient noise margins in MVL circuitry, the M-RTDs should generally have relatively equal peak and valley currents, relatively equally spaced peak voltages, modest peak-to-valley ratio, and low hysteresis. Table 2 shows preferred values for some M-RTD parameters.

TABLE 2

| M-RTD Parameter | Preferred Values |
| --- | --- |
| Peak current variation | $\leq 10\%$ |
| Valley current variation | $\leq 20\%$ |
| Peak voltage spacing deviation from linearity | $\leq 5\%$ |
| Peak-to-valley ratio (PVR) | $\geq 4$ |
| Hysteresis | $\leq 10$ mV |

Similarly, preferred values can be given for the FET switching transistor parameters. Table 3 shows preferred values for some FET parameters.

TABLE 3

| FET Parameter | Preferred Values |
| --- | --- |
| Hysteresis | $\leq 20$ mV |
| Gate-drain breakdown voltage | 4 V |
| Nominal $V_T$ | $-0.3$ V |
| $V_T$ local matching | $\leq 20$ mV |

Figure 12:
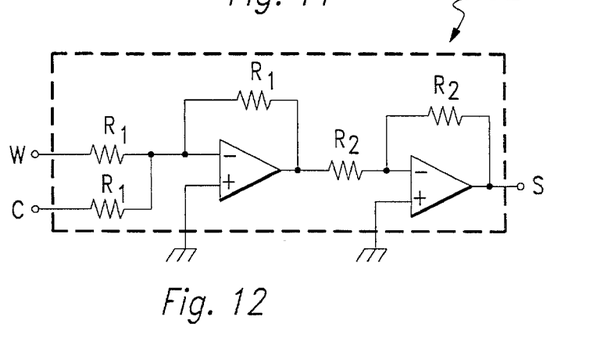
FIG. 12 is a schematic of the preferred embodiment of a summation circuit.

The first preferred embodiment of the summation circuit 52 is shown in FIG. 12. The first amplifier stage produces $-(W+C)$, and the second amplifier stage is an inverter (gain=$-1$) so that $S=W+C$.

Table 4, below, provides an overview of some embodiments and the figures.

TABLE 4

| Figure Element | Generic Term | Preferred or Specific Term | Function/ Alternate Terms |
| --- | --- | --- | --- |
| 40 | two-input summation circuit | | Summation amplifier; Multi-valued half-adder |
| 42 | range-7 multi-valued to binary converter | | Quantizer; Quasi-analog-to-digital converter |
| 44 | three-input summation circuit | | Summation amplifier |
| 46 | Multivalued logic processor | Positive digit range-4 base-2 processor | |
| 48 | Multivalued to Binary converter | Positive digit range-4 base-2 to binary converter | |
| 50 | Range-4 base-2 to binary converter | | |
| 52 | summation circuit | | |
| 53 | Decomposition stage | | A set of range-4 base-2 to binary converters and the associated summation circuits. Operates on a set of interim digits and results in new interim digits and one binary output |
| 54 | multi-level folding circuit | resonant tunneling multi-level folding circuit | |
| 56 | Multiple negative differential transconductance device | Multiple-peak resonant tunneling transistor | Multiple peak resonant tunneling bipolar transistor; Multiple peak resonant tunneling field effect transistor |
| 58 | switching device | Depletion mode FET | Bipolar transistor; Heterojunction bipolar transistor; Field effect transistor |
| 60 | Multiple-peak resonant tunneling diode | Three-peak resonant tunneling diode | I-V characteristic exhibits at least three peaks |
| 62 | active load | Depletion mode FET | |

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families. It should be understood that various embodiments of the invention can employ or be embodied in hardware, software or microcoded firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for converting a range-N digit into an L-digit binary word, said apparatus comprising:

a voltage divider network having an input; and a first level and second level folding circuits, the input of each of said first and second level folding circuits connected to said network and the output being a digit in said L-digit binary word, wherein when said range-N digit is applied to said voltage divider input, said L-digit binary word representing the same numerical value as that of said range-N digit.

2. The apparatus of claim 1, wherein said first and second level folding circuits comprise a load in series with a negative differential transconductance circuit.

3. The apparatus of claim 2, wherein said load comprises a field effect transistor.

4. The apparatus of claim 2, wherein said negative differential transconductance circuit comprises a switching device in series with a negative differential resistance device.

5. The apparatus of claim 4, wherein said negative differential resistance device is a resonant tunneling diode.

6. The apparatus of claim 5, wherein said resonant tunneling diode forms a plurality of peaks with a current-voltage characteristic of the resonant tunneling diode.

7. An apparatus, for converting a base-2 range-4 input word into a binary word including non-negative digits, comprising;

a least significant digit of said word being binary, said base-2 range-4 word having digits S(0) through S(L), where S(0) is the least significant digit and said base-2 range-4 binary word having digits B(0) through B(L+1), B(0) being the least significant digit;

decomposition stages D(1) through D(L), decomposition stage D(n) having an input for an n digit range-4 base-2 word I(n), an output for an n−1 digit range-4 base-2 word O(n) and a binary bit output B(n), the input of D(n) connected to O(n+1), wherein, for each decomposition stage, I(n)=2O(n)+B(n);

whereby when the range-4 base-2 word S(1) through S(L) is applied to I(L), the value of the binary word having digits B(0) through B(L+1) where B(0)=S(0) and is the same as the value of said input word, and wherein said decomposition stage D(n) for i=2 to L comprises n range-4 base-2 to binary converters and n−1 summation circuits;

wherein said range-4 base-2 to binary converters comprise two multi-level folding circuits connected by a voltage divider.

8. The apparatus of claim 7, wherein said multi-level folding circuits comprise a negative differential transconductance device.

9. The apparatus of claim 8, wherein said negative differential transconductance device comprises a switching device and a peak resonant tunneling diode.

10. The apparatus of claim 9, wherein said peak resonant tunneling diode exhibits three peaks in its current-voltage characteristic.

11. An apparatus for converting a base-M range-N input word into a binary output word having a plurality of digits, said apparatus comprising:

a plurality of cascaded decomposition stages, each of said cascaded decomposition stages operable to produce one of the digits of said binary output word.

12. The apparatus of claim 11, wherein M=2 and N=4.

13. The apparatus of claim 12, wherein the digits of said base-M range-N word are non-negative.

14. The apparatus of claim 13, wherein a least significant digit of said input word is binary.

15. The apparatus of claim 14, wherein said range-4 base-2 word has digits S(0) through S(L), S(0) being the least significant digit, and said binary word has digits B(0) through B(L+1), B(0) being the least significant digit, said apparatus comprising:

decomposition stages D(1) through D(L), decomposition stage D(n) having an input for an n digit range-4 base-2 word I(n), an output for an n−1 digit range-4 base-2 word O(n) and a binary bit output B(L−n+1), O(n) applied to D(n), wherein, for each decomposition stage, I(n)=2O(n)+B(L−n+1);

whereby when the range-4 base-2 word S(1) through S(L) is applied to I(L), the value of the binary word having digits B(0) through B(L+1) where B(0)=S(0) is the same as the value of said input word.

16. The apparatus of claim 15, wherein said decomposition stage D(n) for i=2 to L comprise n range-4 base-2 to binary converters and at least one summation circuit.

17. The apparatus of claim 16, wherein said range-4 base-2 to binary converters comprise two multi-level folding circuits with inputs connected by a voltage divider.

18. The apparatus of claim 17, wherein said multi-level folding circuits comprise a negative differential transconductance circuit.

19. The apparatus of claim 18, wherein said negative differential transconductance circuit comprises a switching device in series with a negative differential resistance device.

20. The apparatus of claim 19, wherein said negative differential resistance device is a peak resonant tunneling device.

21. The apparatus of claim 20, wherein said peak resonant tunneling device exhibits at least three peaks in its current voltage characteristic.

* * * * *